United States Patent
Liu et al.

(10) Patent No.: US 10,014,827 B2
(45) Date of Patent: Jul. 3, 2018

(54) POWER-ADJUSTABLE RADIO FREQUENCY OUTPUT CIRCUIT

(71) Applicant: Beijing BBEF Science & Technology Co., Ltd., Beijing (CN)

(72) Inventors: Xuewen Liu, Beijing (CN); Guangjian Li, Beijing (CN); Zhenyu Yuan, Beijing (CN); Nianxi Xue, Beijing (CN); Weize Li, Beijing (CN)

(73) Assignee: Beijing BBEF Science & Technology Co., Ltd., Beijing (CN)

( * ) Notice: Subject to any disclaimer, the term of this patent is extended or adjusted under 35 U.S.C. 154(b) by 0 days.

(21) Appl. No.: 15/591,111

(22) Filed: May 10, 2017

(65) Prior Publication Data

US 2017/0244364 A1    Aug. 24, 2017

(30) Foreign Application Priority Data

Dec. 6, 2016    (CN) .......................... 2016 1 1107675

(51) Int. Cl.
| | |
|---|---|
| *H03F 3/04* | (2006.01) |
| *H03F 1/02* | (2006.01) |
| *H03F 3/19* | (2006.01) |
| *H03F 3/21* | (2006.01) |
| *H03F 1/52* | (2006.01) |

(52) U.S. Cl.
CPC ......... *H03F 1/0216* (2013.01); *H03F 1/0261* (2013.01); *H03F 1/523* (2013.01); *H03F 3/19* (2013.01); *H03F 3/21* (2013.01); *H03F 2200/171* (2013.01); *H03F 2200/18* (2013.01); *H03F 2200/451* (2013.01); *H03F 2200/534* (2013.01); *H03F 2200/541* (2013.01)

(58) Field of Classification Search
CPC .... H03F 3/919; H03F 3/193; H03F 2200/534; H03F 3/191; H03F 2200/522
USPC ................ 330/165, 188, 301, 302, 306, 296
See application file for complete search history.

(56) References Cited

U.S. PATENT DOCUMENTS

| | | | | |
|---|---|---|---|---|
| 5,420,537 A | * | 5/1995 | Weedon | ................... H03F 3/193 330/251 |
| 7,471,155 B1 | * | 12/2008 | Levesque | .................. H03F 1/30 330/296 |

* cited by examiner

*Primary Examiner* — Steven J Mottola

(57) ABSTRACT

A power-adjustable RF (radio frequency) output circuit is disclosed, which includes a RF frequency source transformer, wherein: one output end of the RF frequency source transformer is connected with a gate of a power amplifier module, another output end of the RF frequency source transformer is connected with a gate bias voltage control circuit; a source of the power amplifier module is connected with ground; the gate of the power amplifier module is connected with a resistor which is connected with ground, a drain of the power amplifier module is connected with a fixed voltage DC (direct current) power supply and also connected with a RF filtering network for outputting a RF power through the RF filtering network.

9 Claims, 2 Drawing Sheets

POWER-ADJUSTABLE RADIO FREQUENCY OUTPUT CIRCUIT

CROSS REFERENCE OF RELATED APPLICATION

The present invention claims priority under 35 U.S.C. 119(a-d) to CN 201611107675.1, filed Dec. 6, 2016.

BACKGROUND OF THE PRESENT INVENTION

Field of Invention

The present invention relates to an electronic field, and more particularly to a power-adjustable RF (radio frequency) output circuit.

Description of Related Arts

At present, in RF power fields, radio and television fields, etc., there are two methods to conveniently adjust the RF output power with the needs of users. The first method is to adjust the RF input signal amplitude. The second method is to adjust the main power supply voltage on the drain of the power amplifier module.

The first method adopts DDS (Direct Digital Synthesizer) to generate the RF frequency source, which is more adapted for the broadband RF power supply or transmitter. It is unable to adopt the crystal with temperature compensation to simply generate a fixed and precise RF frequency source, so that it becomes complex and much higher in control cost.

In the second method, the RF frequency source is simply generated by the crystal with temperature compensation, but the main voltage supplied to the drain of the power amplifier module must be variable. However, the switching power supply voltage is made into a fixed output, which is better controlled, easier and more stable than a variable output.

The MOSFET (Metal-Oxide-Semiconductor Field Effect Transistor) is a voltage-controlled component, that is, the working state of the MOSFET varies with changing the control voltage applied to the gate. The deep negative bias voltage allows the MOSFET to stop working. In the above-mentioned two methods for changing the RF output power, the bias voltage at the gate of the power amplifier module is set to a fixed value (such as 2.5 VDC, 2.8 VDC, or 3 VDC).

SUMMARY OF THE PRESENT INVENTION

An object of the present invention is to provide a RF (radio frequency) output circuit, which is capable of achieving a change of a RF power output through changing a gate bias voltage of a MOSFET without changing a RF input signal amplitude or a drain supply voltage of a power amplifier module.

Accordingly, in order to accomplish the above object, technical solutions of the present invention are as follows.

A power-adjustable RF (radio frequency) output circuit comprises a RF frequency source transformer, wherein: one output end of the RF frequency source transformer is connected with a gate of a power amplifier module, another output end of the RF frequency source transformer is connected with a gate bias voltage control circuit; a source of the power amplifier module is connected with ground; the gate of the power amplifier module is connected with a resistor which is connected with ground, a drain of the power amplifier module is connected with a fixed voltage DC (direct current) power supply and also connected with a RF filtering network for outputting a RF power through the RF filtering network.

A further improvement is that: the gate bias voltage control circuit comprises an operational amplifying module, a positive input terminal of the operational amplifying module is connected with a bias voltage control network, an output terminal of the operational amplifying module is connected with a relay which is controlled by an interlocking circuit; a normally open contact of the relay is connected with the output terminal of the operational amplifying module, a normally closed contact of the relay is connected with a negative bias voltage circuit; a moving contact of the relay is connected with an AC (alternating current) isolation transformer, the AC isolation transformer is connected with the RF frequency source transformer.

A further improvement is that: the operational amplifying module comprises an OA (operational amplifier), wherein: a negative input terminal of the OA is connected with a 10V power supply through a 178KΩ resistor, and also connected with ground through a 1 KΩ resistor; an output terminal of the OA is in feedback connection with the negative input terminal thereof through a 150 KΩ resistor; a positive input terminal of the OA is connected with the bias voltage control network; the output terminal of the OA is connected with the relay.

A further improvement is that: the relay is connected with a diode in parallel which is adapted for protecting the relay; the relay is connected with the interlocking circuit through a voltage stabilizing circuit; the interlocking circuit is adapted for providing a power and an internal interlocking signal for the relay; the voltage stabilizing circuit comprises a zener diode and a resistor.

A further improvement is that: the gate bias voltage control circuit comprises a filtering capacitor.

A further improvement is that: there are two filtering capacitors, wherein: one filtering capacitor is connected with the output terminal of the operational amplifying module and the other filtering capacitor is connected with the moving contact of the relay.

A further improvement is that: a filtering capacitor is located between the AC isolation transformer and the RF frequency source transformer.

A further improvement is that: a protector is located between the AC isolation transformer and the RF frequency source transformer, wherein: the protector comprises two zener protection diodes.

A further improvement is that: the AC isolation transformer, the RF frequency source transformer and the power amplifying module are all installed on a RF power amplifier circuit PCB (Printed circuit board), and the AC isolation transformer is connected with the gate bias voltage control circuit through a 3-pin connector.

A further improvement is that: the fixed voltage DC power supply is provided by a switching power supply.

Beneficial effects of the present invention are as follows.

1. The present invention is able to eliminate complicated DDS-related control circuits and software, thereby saving development time and cost.

2. The present invention adopts the switching power supply with the fixed output, so that it has less control links, stable power supply and long service life.

3. The present invention provides a new method for controlling a RF power output, so that the whole link of the device becomes simple, and the device is easy to be maintained, works stably and reliably, and is more suitable for 24 hours of continuous work.

DETAILED DESCRIPTION OF THE PREFERRED EMBODIMENT

The present invention is further clearly and completely explained with accompanying embodiments and drawings.

Figure 1:
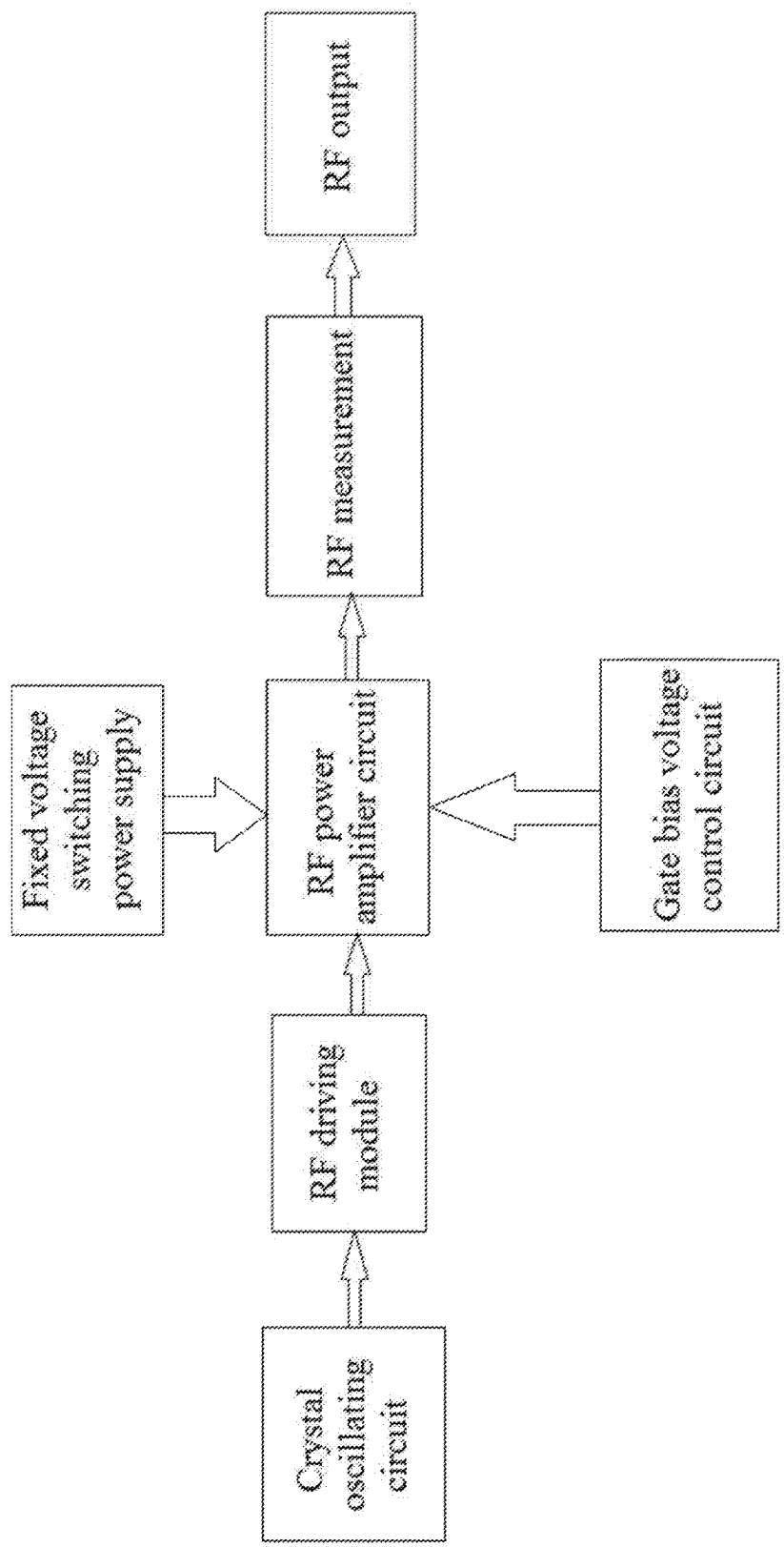
FIG. 1 is a schematic diagram of a power-adjustable RF (radio frequency) output circuit according to a preferred embodiment of the present invention.

FIG. 1 is a schematic diagram of a power-adjustable RF (radio frequency) output circuit according to a preferred embodiment of the present invention, wherein: a RF frequency source is generated by a crystal with temperature compensation, a main supply voltage on a drain of a power amplifier module is fixed and a bias voltage on a gate of the power amplifier module is changed to realize a change of a RF output power.

Figure 2:
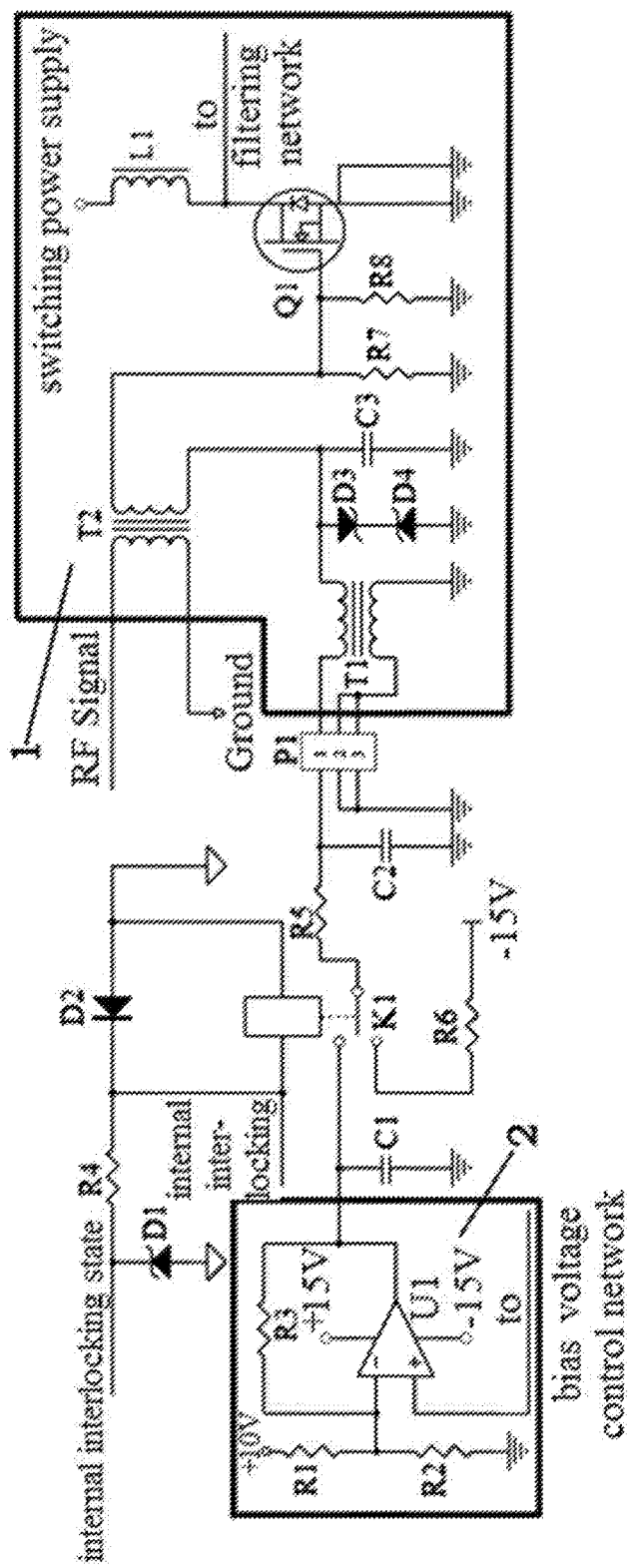
FIG. 2 is a circuit diagram of the power-adjustable RF (radio frequency) output circuit according to the above preferred embodiment of the present invention.

FIG. 2 is a circuit diagram of the power-adjustable RF (radio frequency) output circuit according to the above preferred embodiment of the present invention, wherein: Q1 is the power amplifier module comprising a MOSFET for amplifying power, a limit value of Vgs (wherein: "g" represents a gate of the module, "s" represents a source of the module, and Vgs represents a voltage between the gate and the source) is ±30 V; T2 is a RF frequency source transformer for coupling and transforming RF signals with constant amplitude which are from a driving module, and then providing the coupled and transformed RF signals as input signals for the gate of the power amplifier module; R7 and R8 are adapted to provide a bias resistance for the gate of Q1 and are connected with each other in parallel to convenient for selecting an appropriate resistance and increasing a tolerable power; L1 is a choke coil and participated in matching and filtering network; D3 and D4 are both zener diodes for protecting the amplitude (whose values are determined by the Vgs of the power amplifier module); C3 is adapted for filtering and providing an alternating ground for a secondary of T2.

An AC (alternating current) isolation transformer T1 is adapted for providing a DC (direct current) bias voltage for the gate of the power amplifier module, and the RF output power is adjusted by changing the DC bias voltage. A specific gate bias voltage control circuit is shown in a left half of FIG. 2, wherein: an operational amplifying module 2 comprises a high-speed operational amplifier, the high-speed operational amplifier U1 and peripheral resistors R1, R2 and R3 form a comparison, amplifying and isolation circuit, an output of the comparison, amplifying and isolation circuit varies with changing an output of a bias voltage control network; the operational amplifying module 2 is connected with a normally open contact of a relay K1, a moving contact of the relay K1 is connected with the AC isolation transformer T1; comparators C1 and C2 are adapted for filtering out spurious signals generating during the relay operation and AC and clutter signals on the bias voltage; the high-speed operational amplifier and C1, C2 together form an isolation circuit to prevent incompletely isolated AC signals of the AC isolation transformer T1 from affecting "the bias voltage control network".

As shown in FIG. 2, the AC isolation transformer, the RF frequency source transformer and the power amplifier module are able to be installed on a RF power amplifier circuit PCB (printed circuit board, which is shown in solid line box 1 of FIG. 2), the AC isolation transformer is connected with the bias voltage control circuit through a 3-pin connector.

The relay is provided with power by an interlocking circuit; a resistor R4 and a zener diode D1 form a voltage stabilizing circuit for providing a high-lever (5.1V) internal interlocking signal; a diode D2 is connected with a coil of the relay in parallel for protecting the relay; the internal interlocking simultaneously transmits a 8V DC, if the interlocking is wrong, a 5.1V voltage is unable to be taken at an internal interlocking state, R5 is connected with R6 through a normally closed contact of the relay K1, and at this time, the bias voltage on the gate of the power amplifier module Q1 is −12.55V (namely, R5 is connected with R6 in series and R7 is connected with R8 in parallel for forming a bleeder circuit, and now, a partial pressure of the gate of Q1 is (1950÷2331)×15), the RF power module is in a deep negative bias state, work is cut off.

Workflow of the present invention is as follows.

When the internal interlocking is normal, a whole system works properly, the relay K1 pulls, the moving contact and the normally open contact of K1 are connected with each other. When the RF power is not applied to the system, the voltage on the gate of Q1 is −8.4V, and at this time, the power amplifier module Q1 is still in the deep negative bias state, the work is cut off, the outputted RF power is zero. When the system begins to add power, the bias voltage control network outputs a corresponding signal, the gate bias voltage control circuit applies a corresponding bias voltage to the gate of the power amplifier module. The larger the power to be added, the larger the output parameter of the bias voltage control network, the larger the bias voltage applied to the gate. As shown in FIG. 2, two power amplifier modules are used, when the bias voltages applied to the gate of the power amplifier module are 1.305V, 1.503V, 1.658V, 2.084V, 2.473V, the RF output powers generated by the two power amplifier modules are 100 W, 300 W, 500 W, 1000 W, 1500 W, respectively.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A power-adjustable RF (radio frequency) output circuit, comprising: a RF frequency source transformer, wherein:
   one output end of the RF frequency source transformer is connected with a gate of a power amplifier module, another output end of the RF frequency source transformer is connected with a gate bias voltage control circuit; a source of the power amplifier module is connected with ground; the gate of the power amplifier module is connected with a resistor which is connected with ground, a drain of the power amplifier module is connected with a fixed voltage DC (direct current)

power supply and also connected with a RF filtering network for outputting a RF power through the RF filtering network;

the gate bias voltage control circuit comprises an operational amplifying module, a positive input terminal of the operational amplifying module is connected with a bias voltage control network, an output terminal of the operational amplifying module is connected with a relay which is controlled by an interlocking circuit; a normally open contact of the relay is connected with the output terminal of the operational amplifying module, a normally closed contact of the relay is connected with a negative bias voltage circuit; a moving contact of the relay is connected with an AC (alternating current) isolation transformer, the AC isolation transformer is connected with the RF frequency source transformer.

2. The power-adjustable RF output circuit, as recited in claim 1, wherein: the operational amplifying module comprises an OA (operational amplifier), a negative input terminal of the OA is connected with a 10V power supply through a 178 KΩ resistor, and also connected with ground through a 1 KΩ resistor; an output terminal of the OA is in feedback connection with the negative input terminal thereof through a 150 KΩ resistor; a positive input terminal of the OA is connected with the bias voltage control network; the output terminal of the OA is connected with the relay.

3. The power-adjustable RF output circuit, as recited in claim 1, wherein: the relay is connected with a diode in parallel which is adapted for protecting the relay; the relay is connected with the interlocking circuit through a voltage stabilizing circuit; the interlocking circuit is adapted for providing a power and an internal interlocking signal for the relay; the voltage stabilizing circuit comprises a zener diode and a resistor.

4. The power-adjustable RF output circuit, as recited in claim 1, wherein: the gate bias voltage control circuit comprises a filtering capacitor.

5. The power-adjustable RF output circuit, as recited in claim 4, wherein: there are two filtering capacitors, one filtering capacitor is connected with the output terminal of the operational amplifying module and the other filtering capacitor is connected with the moving contact of the relay.

6. The power-adjustable RF output circuit, as recited in claim 1, wherein: a filtering capacitor is located between the AC isolation transformer and the RF frequency source transformer.

7. The power-adjustable RF output circuit, as recited in claim 1, wherein: a protector is located between the AC isolation transformer and the RF frequency source transformer, the protector comprises two zener protection diodes.

8. The power-adjustable RF output circuit, as recited in claim 1, wherein: the AC isolation transformer, the RF frequency source transformer and the power amplifying module are all installed on a RF power amplifier circuit PCB (printed circuit board), and the AC isolation transformer is connected with the gate bias voltage control circuit through a 3-pin connector.

9. The power-adjustable RF output circuit, as recited in claim 1, wherein: the fixed voltage DC power supply is provided by a switching power supply.

* * * * *